(12) United States Patent
Kim

(10) Patent No.: US 6,281,537 B1
(45) Date of Patent: Aug. 28, 2001

(54) FERROELECTRIC MEMORY DEVICE GUARANTEEING ELECTRICAL INTERCONNECTION BETWEEN LOWER CAPACITOR ELECTRODE AND CONTACT PLUG AND METHOD FOR FABRICATING THE SAME

(75) Inventor: Jae Whan Kim, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/290,245

(22) Filed: Apr. 13, 1999

Related U.S. Application Data

(62) Division of application No. 09/107,288, filed on Jun. 30, 1998, now Pat. No. 6,020,233.

(30) Foreign Application Priority Data

Jun. 30, 1997 (KR) .................................. 97-29648
Nov. 20, 1997 (KR) .................................. 97-61557

(51) Int. Cl.[7] ...................... H01L 31/119; H01L 27/108; H01L 29/76; H01L 29/94
(52) U.S. Cl. .......................... 257/295; 257/306
(58) Field of Search ................... 257/295–310; 438/3, 240, 253, 254, 396–398

(56) References Cited

U.S. PATENT DOCUMENTS

| 5,508,953 | 4/1996 | Fukuda et al. . |
| 5,572,052 | 11/1996 | Kashihara et al. . |
| 5,621,606 | * 4/1997 | Hwang ................................. 257/296 |
| 5,798,903 | * 8/1998 | Dhote et al. ......................... 257/306 |
| 5,825,609 | * 10/1998 | Andricacos et al. ................. 257/295 |

* cited by examiner

Primary Examiner—Steven Loke
Assistant Examiner—Cuong Quang Nguyen
(74) Attorney, Agent, or Firm—Jacobson Holman, PLLC

(57) ABSTRACT

The present invention provides an improved ferroelectric capacitor used in a memory device by providing reliable electric interconnection between a lower electrode of the capacitor and an active region of transistor, and to provide a method for fabricating the same. A semiconductor capacitor according to the present invention comprises: a first conducting film filling an opening which is formed in an interlayer insulating film, being in contact with an active region of a semiconductor; a stacked charge storage node including a second conducting film formed on the first conducting film and an interlaying insulating film, a first diffusion preventing film formed on the second conducting film, a lower electrode film formed on the first diffusion preventing film, and a ferroelectric film formed on the lower electrode film; and a conducting spacer film formed on sidewalls of the lower electrode film, the first diffusion preventing film and the second conducting film.

6 Claims, 8 Drawing Sheets

FERROELECTRIC MEMORY DEVICE GUARANTEEING ELECTRICAL INTERCONNECTION BETWEEN LOWER CAPACITOR ELECTRODE AND CONTACT PLUG AND METHOD FOR FABRICATING THE SAME

This is a divisional application of application Ser. No. 09/107,288 filed Jun. 30, 1998 Pat. No. 6,020,233.

BACKGROUND OF THE INVENTION

1. Field of the Invention

The present invention relates to a highly integrated memory device, and more particularly to a ferroelectric capacitor memory device capable of improving an electrical interconnection between a lower electrode and an active region of a cell transistor.

2. Description of the Related Art

In general, a Pt film has been widely used as a lower electrode in highly integrated DRAM cells employing high dielectric materials as well as non-volatile memory device employing ferroelectric materials such as BST[Ba(Sr,Ti)O$_3$].

FIG. 1 is a cross-sectional view of a conventional ferroelectric memory device having a Pt film as a lower electrode of a capacitor. As shown in FIG. 1, a capacitor in the conventional memory device is made up of a polysilicon plug 6, a diffusion preventing film 7 and a lower electrode 8 such as a Pt film. Since the Pt film, which is commonly used as the lower electrode 8, doesn't act as a barrier film preventing oxygen atoms from diffusing into its underlayer, the oxygen atoms are diffused into a diffusion preventing film 7 through the Pt film. In FIG. 1, unexplained reference numerals 1 denotes a semiconductor substrate, 2 field oxide film, 3 gate, 4 bit line, 5 interlayer insulating film, and 9 ferroelectric film.

A TiN/Ti film is widely used as the diffusion preventing film 7. The barrier metal films such as TiN and Ti films and the polysilicon film for plug vigorously react on oxygen atoms from the dielectric film so that the oxidation takes place at a relatively low temperature of about 500° C. Accordingly, the electrical interconnection between the lower electrode and an active region of the transistor is broken down. With the increase of the deposition temperature of ferroelectric materials, this problem is getting more serious.

Particularly, in the case of ferroelectric materials, such as SrBi Ta O which is one of the prevailing materials for the ferroelectric capacitor, the temperature required in the deposition and crystallization is approximately 800° C. Therefore, in order to fabricate the ferroelectric memory device on the COB (capacitor on bit line) structure, it is most important to electrically connect the Pt lower electrode to the active region of the MOSFET.

SUMMARY OF THE INVENTION

An object of the present invention is to provide an improved ferroelectric capacitor used in a memory device by providing reliable electrical interconnection between a lower electrode of the capacitor and an active region of transistor, and to provide a method for fabricating the same.

Another object of the present invention is to provide an ferroelectric capacitor to which excellent film properties of films are available, by achieving various selection of materials of a charge storage electrode.

In accordance with an aspect of the present invention, there is a provided a capacitor in a semiconductor device comprising: a first conducting film filling an opening which is formed in an interlayer insulating film, being in contact with an active region of a semiconductor; a stacked charge storage node including a second conducting film formed on the first conducting film and an interlayer insulating film, a first diffusion preventing film formed on the second diffusion film, a lower electrode film formed on the first diffusion preventing film, and a ferroelectric film formed on the lower electrode film; and a conducting spacer film formed on sidewalls of the lower electrode film, the first diffusion preventing film and the second conducting film.

In accordance with another aspect of the present invention, there is a provided a method for fabricating a capacitor in a semiconductor device comprising the steps of: forming an insulating film having an opening exposing an active region of a semiconductor substrate; forming a first conducting film for a contact plug filling the opening; forming a second conducting film, a first diffusion preventing film, a lower electrode film of the capacitor, a ferroelectric film and a second diffusion preventing film, in this order, on the insulating film and the first conducting film, so that a stacked charge storage node is formed; patterning the stacked charge storage node; forming a conducting spacer film electrically connecting the lower electrode film to the second conducting film on sidewalls of the stacked charge storage node, thereby forming a resulting structure; and forming a third diffusion preventing film on the resulting structure.

In accordance with further another aspect of the present invention, there is a provided a capacitor in a semiconductor device comprising: a first conducting film filling an opening which is formed in an interlayer insulating film, being in contact with an active region of a semiconductor; a first stacked structure including a second conducting film formed on the first conducting film and an interlayer insulating film, a first diffusion preventing film formed on the second conducting film, a lower electrode film formed on the first diffusion preventing film; a second stacked structure including a ferroelectric film formed on the lower electrode film and an upper electrode film formed on the ferroelectric film; an insulating spacer film formed on sidewall of the first stacked structure; a conducting spacer film formed on sidewall of the first stacked structure and the insulating spacer film; and a second diffusion preventing film formed on sidewalls of the insulating spacer film and the conducting spacer film.

In accordance with still another aspect of the present invention, there is a provided a method for fabricating a capacitor in a semiconductor device comprising the steps of: forming an insulating film having an opening exposing an active region of a semiconductor substrate; forming a first conducting film for a contact plug filling the opening; forming a second conducting film, a first diffusion preventing film, a lower electrode film of the capacitor, a ferroelectric film, an upper electrode film and an etching mask film, in this order, on the insulating film and the first conducting film; patterning the etching mask film, the upper electrode film and the ferroelectric film; forming an insulating spacer film on sidewalls of the etching mask film, the upper electrode film and the ferroelectric film; etching the lower electrode film, the first diffusion preventing film and the second conducting film, using the etching mask film and the insulating spacer film; forming an conducting spacer film on sidewalls of the etching mask film, the upper electrode film and the ferroelectric film; forming a conducting spacer film electrically connecting the lower electrode film to the second conducting film on sidewalls of the stacked charge storage node, thereby forming a resulting structure; and forming a second diffusion preventing film on the resulting structure.

BRIEF DESCRIPTION OF THE DRAWINGS

Other objects and aspects of the present invention will become apparent from the following description of the embodiments with reference to the accompanying drawings, in which.

DETAILED DESCRIPTION OF THE PREFERRED EMBODIMENTS

Hereinafter, ferroelectric capacitors of a memory device will be described referring to the accompanying drawings.

Figure 2:
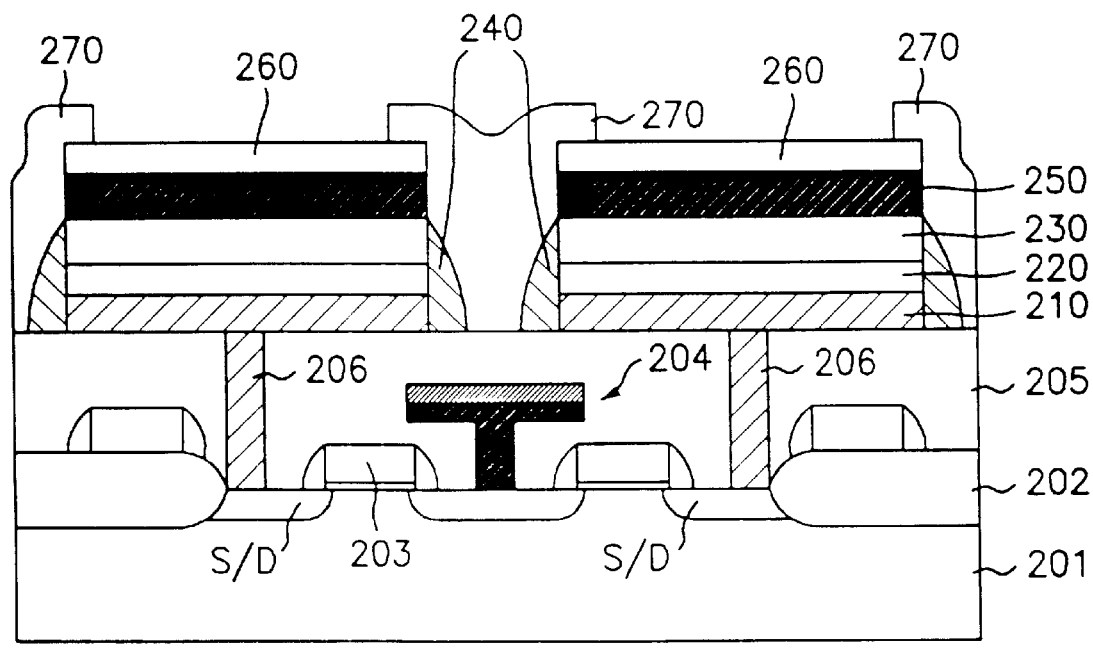
FIG. 2 is a cross-sectional view of a memory device having a ferroelectric capacitor according to the present invention.

First, referring to FIG. 2, the ferroelectric memory device in accordance with the present invention is shown on the COB structure. As shown in the drawing, the ferroelectric memory device of the present invention includes a general MOSFET composed of gate 203, a source and drain (S/D) formed in a semiconductor substrate 201 and a ferroelectric capacitor structure electrically coupled to the source and drain (S/D). Also, an insulating film 205 for planarization is coated on the resulting structure, covering a bit line 204. The ferroelectric capacitor of the present invention has a pattern including a polysilicon plug 206 coupled to the source and the drain (S/D) of the MOSFET, a polysilicon film 210 used for electrical conductor which is in order formed on the polysilicon plug 206 and the insulating film 205. Further, the present invention includes a diffusion barrier film (or barrier metal film) 220 formed on the polysilicon film 210, a lower electrode film 230 formed on the diffusion barrier film 210 and a ferroelectric film (or dielectric materials with significant high dielectric constant) 250 formed on the lower electrode film 230, and includes an upper electrode 260 formed on the ferroelectric film 250.

However, the ferroelectric memory device according to the present invention includes a new capacitor structure which is in contact with the source and drain (S/D) of the MOSFET. That is, breaking of electrical interconnection between a Pt lower electrode 230 and the source coupling (S/D), which is caused by the oxidation of the diffusion barrier film 220 and the polysilicon film 210, may be previously prevented by forming a conducting spacer 240 on the sidewall of the charge. The conducting spacer 240, as the most distinctive feature of the present invention, electrically connects the Pt lower electrode 230 to the polysilicon film 210. The polysilicon plug 206 and the polysilicon film 210 can be made of other material, which is selected from the group consisting of conducting oxide films, conducting nitride films, silicide, a metal film including Al, Ti, Cu, W, Ta, Pt, Au, Pd, Rh, Ir, Re, La, Sr, Sc or Co, and their metal alloy films.

Moreover, in the ferroelectric capacitor according to the present invention, a diffusion preventing film 270 is formed on the conducting spacer 240, the sidewalls of the upper portion of the charge storage node and an upper edge part thereof, wherein oxide films such as silicon nitride film, $TiO_2$, $SiO_2$ and etc. may be used for the insulating film. The conducting spacer 240 is selected from the group consisting of conducting oxide films, conducting nitride films, silicide, a metal film including Al, Ti, Cu, W, Ta, Pt, Au, Pd, Rh, Ir, Re, La, Sr, Sc or Co, and their metal alloy films.

In general, in highly integrated memory devices, the poor interconnection between the capacitor electrode and MOSFET due to the oxidation of the diffusion preventing film and the polysilicon film mostly results from an exposure in oxygen atmosphere at a high temperature, that is, from a dielectric film deposition and crystallization process. In the present invention, such a matter will be essentially settled, by forming a sidewall conducting film electrically connects the lower electrode 230 to the active region of MOSFET through the polysilicon film 210 and the polysilicon plug 206 after the deposition of ferroelectric film and crystallization process. Meanwhile, as well-known to those having ordinary skill in the art, the diffusion preventing film 270 and the upper electrode itself may have various types besides the kinds of above-mentioned films, and it will be explained in detail in the manufacturing process of the present invention to be hereinafter described.

Figure 3A:
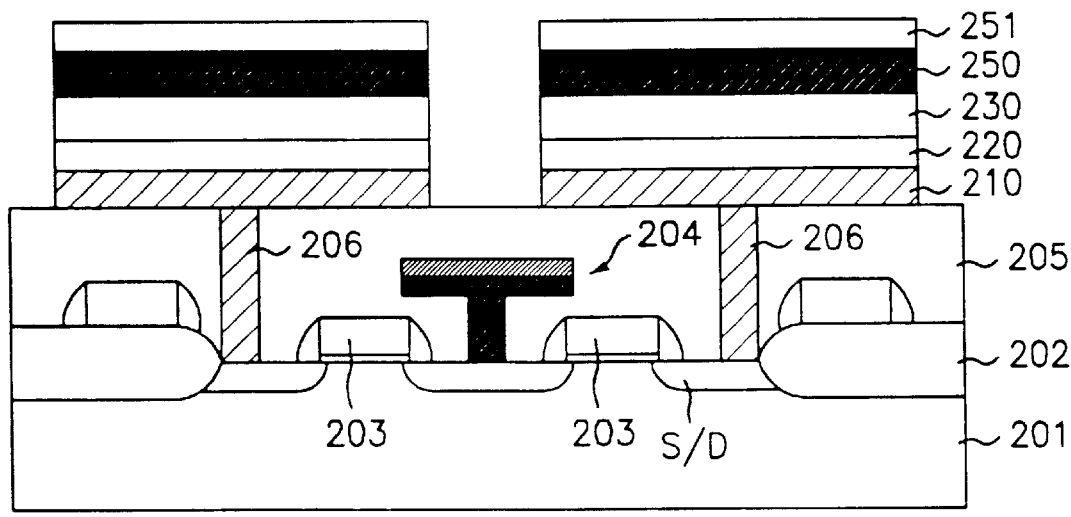
FIGS. 3A to 3C are cross-sectional views illustrating a method for fabricating a memory device having a ferroelectric capacitor according to one embodiment of the present invention.
Figure 3B:
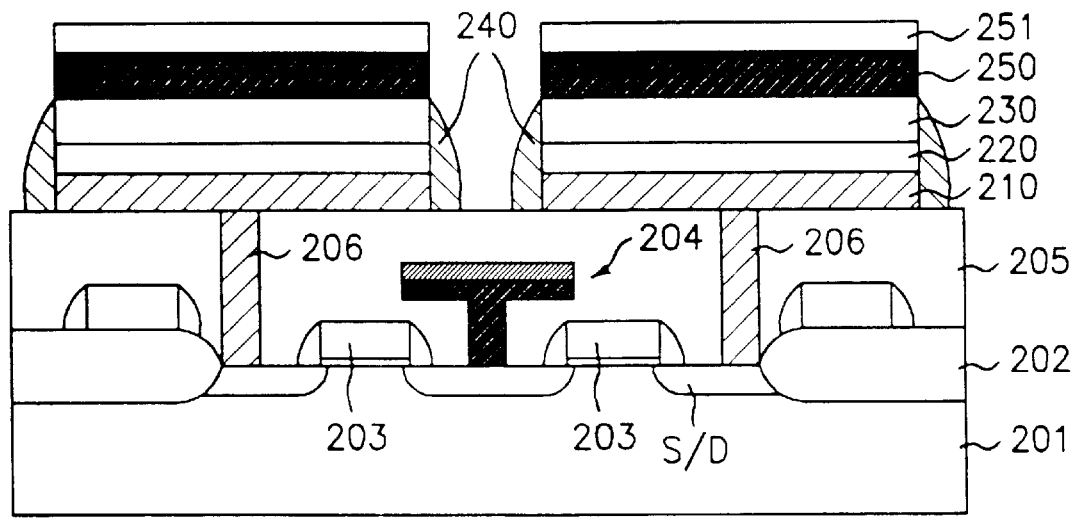
Figure 3C:
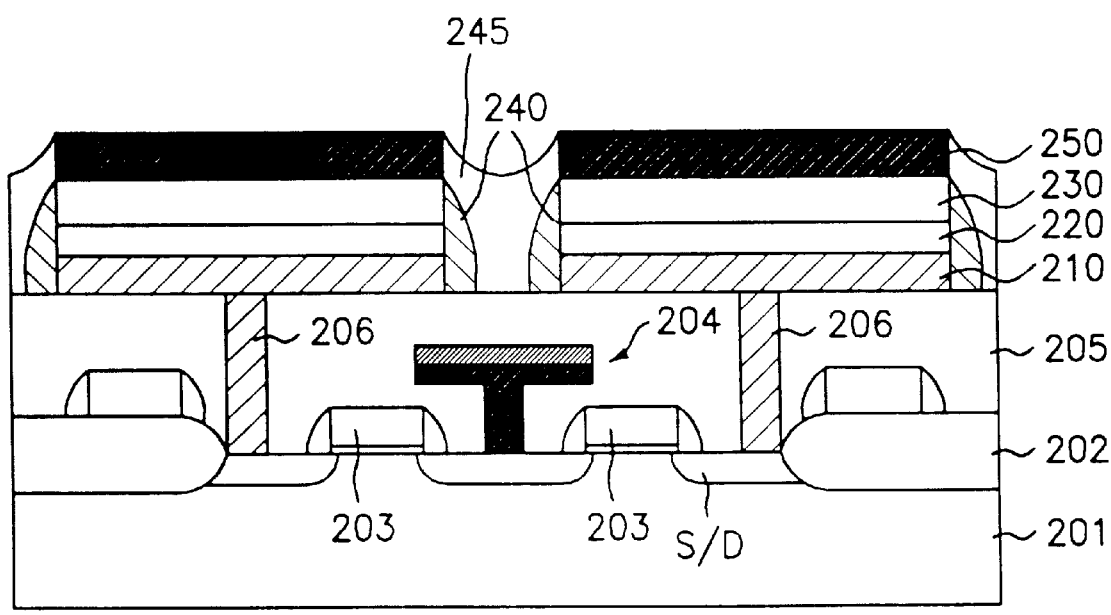

FIGS. 3A to 3C illustrates the manufacturing process of a ferroelectric memory device according to the first embodiment of the present invention, in which the capacitor forming process will be mainly described in detail.

First, referring to FIG. 3A, the interlayer insulating film 205 for planarization is formed on the resulting structure, after forming the MOSFET including the gate 203, the source and drain (S/D) and a bit line 204 in predetermined area of the semiconductor substrate 201. Then, after forming contact hole exposing the source and drain (S/D), the polysilicon plug 206 which is in contact with the source and drain (S/D) is formed. Subsequently, the polysilicon film 210 used for a conducting film, the diffusion preventing film 220 such as $TiO_2$ and the capacitor lower electrode film 230 are, in this order, formed on the interlayer insulating film 205 and the polysilicon plug 206. After depositing and crystallizing the ferroelectric film 250, such as BST, PZT or Y1, on the lower electrode film 230, a diffusion preventing film 251 is formed on the ferroelectric films 250. At this time, the diffusion preventing film 251 is formed by $TiO_2$ film in a preferred embodiment, while it may be made of a conducting, insulating or semiconductor film. Additionally, it is desirable to let the deposition temperature of the diffusion preventing films 220, 251 and 270 below 900° C. Capacitor per each cell is defined by carrying out a selective etching process using a charge storage mask to pattern the stacked films. On the other hand, in case the contact plug and the polysilicon film can be replaced with other materials, it is possible to provide additional conducting film for improving adhesion between the two film.

Here, the diffusion preventing film 220 may be selected out of the materials capable of carrying out a role of diffusion barrier and the polysilicon film 210 may be replaced with a conducting film capable of carrying out a role of oxidation barrier due to the surface oxidation. In addition, the surface oxidation film of polysilicon film 210 which is able to occur during process, or the diffusion preventing film 220 does not have to be a conducting film, provided that it carries out such a role that the lowest part of polysilicon film 210 or the conductivity of plug 206 may not be damaged by the oxygen atoms diffused from the deposit of the ferroelectric film and the thermal treatment process. Therefore, the extended range of selectable materials may guarantee the formation of excellent ferroelectric capacitors. It is based on a conducting spacer described in the present invention, which is illustrated in detail in FIG. 3B.

As shown in FIG. 3B, a conducting film is formed on the resulting structure and is subject to the blanket etching process without an etching mask. At this time, the etching, which is, in fact, over-etching, is controlled so that the highest part of the conducting spacer 240 should be close to the Pt lower electrode 230. Here, it is disclosed that the Pt lower electrode film 230 and MOSFET's source are electrically and safely connected through the conducting spacer 240, the lower part of the polysilicon film 210 and the polysilicon plug 306.

Referring to FIG. 3C, a diffusion preventing film (commonly oxide film) 245 which carries out a role of diffusion barrier is formed to prevent electrical interconnection between conducting films from being broken due to the subsequent oxidization. After such a formation of the diffusion preventing film 245, it is subject to the blanket etching process without an etching mask and then the conducting spacer 240 and the sidewall of the dielectric film are coated with the diffusion preventing film 245. At this time, since the lower part of the conducting spacer 240, the polysilicon film 210 and the upper part of polysilicon plug 206 are projected by thick diffusion preventing film 245, the stacked electrodes of the capacitor are electrically and safely coupled to MOSFET without oxidation although temperature rises in following process.

Finally, an upper electrode is formed on the ferroelectric films 250 using a general method for fabricating a capacitor electrode.

Figure 4A:
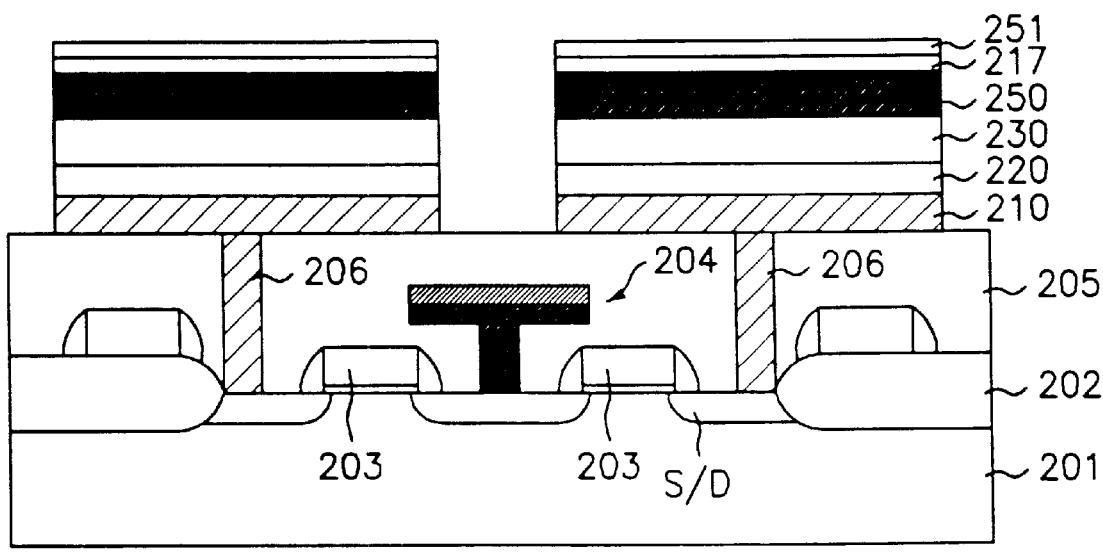
FIGS. 4A to 4C are cross-sectional views illustrating a method for fabricating a memory device having a ferroelectric capacitor according to another embodiment of the present invention.
Figure 4B:
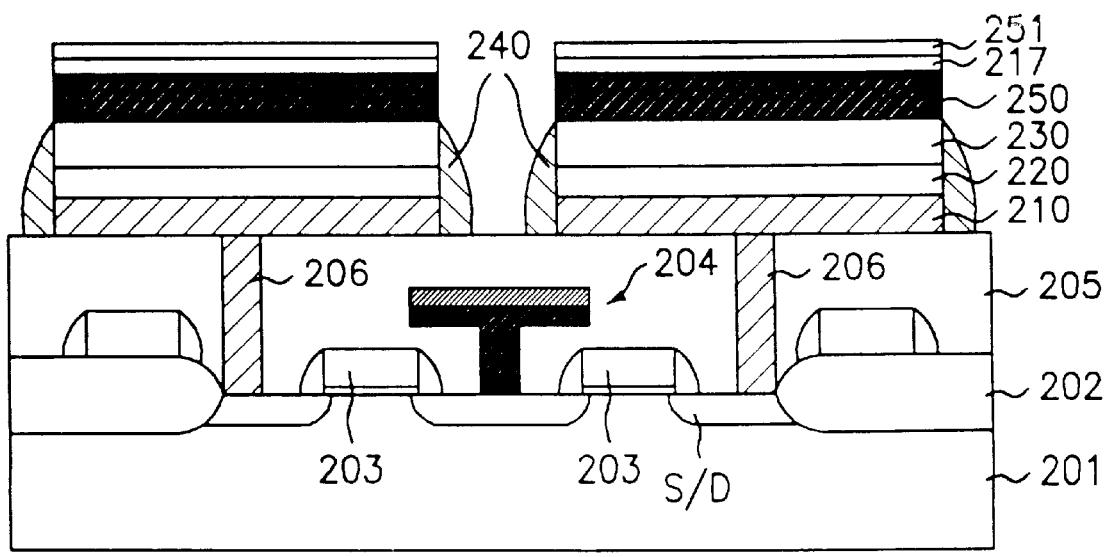
Figure 4C:
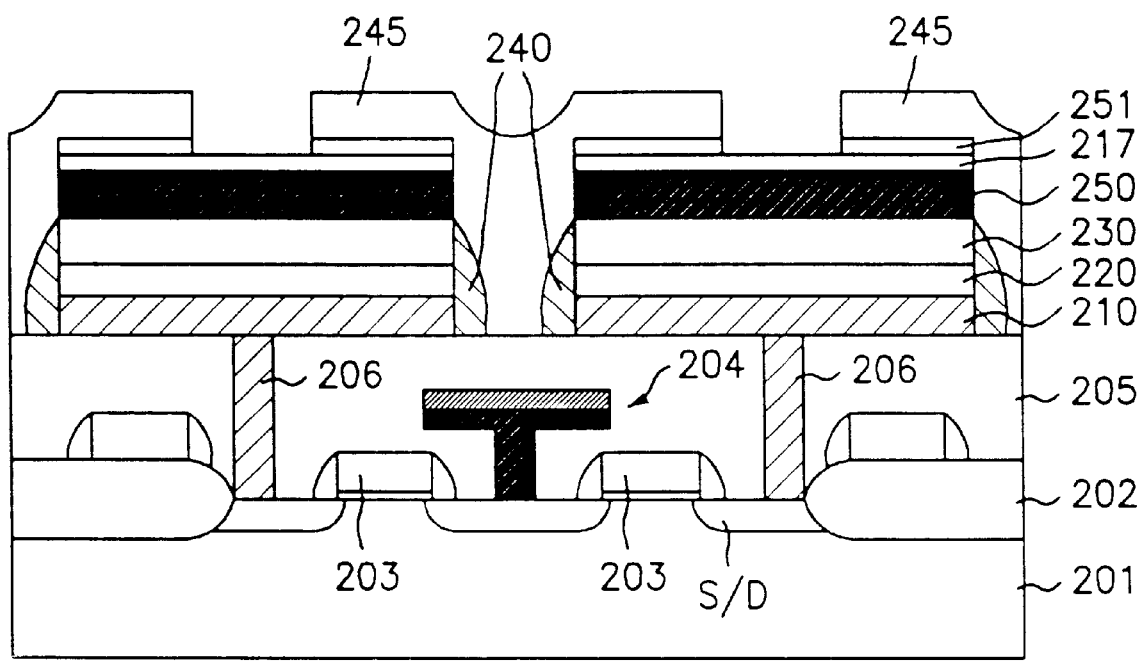

FIGS. 4A to 4C are cross-sectional views illustrating a method for fabricating a memory device having a ferroelectric capacitor according to another embodiment of the present invention. This embodiment illustrates a method for fabricating the conducting spacer 240 and the diffusion preventing film 245, after forming a Pt upper electrode 217. The diffusion preventing film 245 is patterned by the selective etching process using an etching mask. Other purposes are all the same as those set forth in FIG. 3C.

Further another embodiment of the present invention will be described in detail referring to FIGS. 5A to 5F.

Figure 5A:
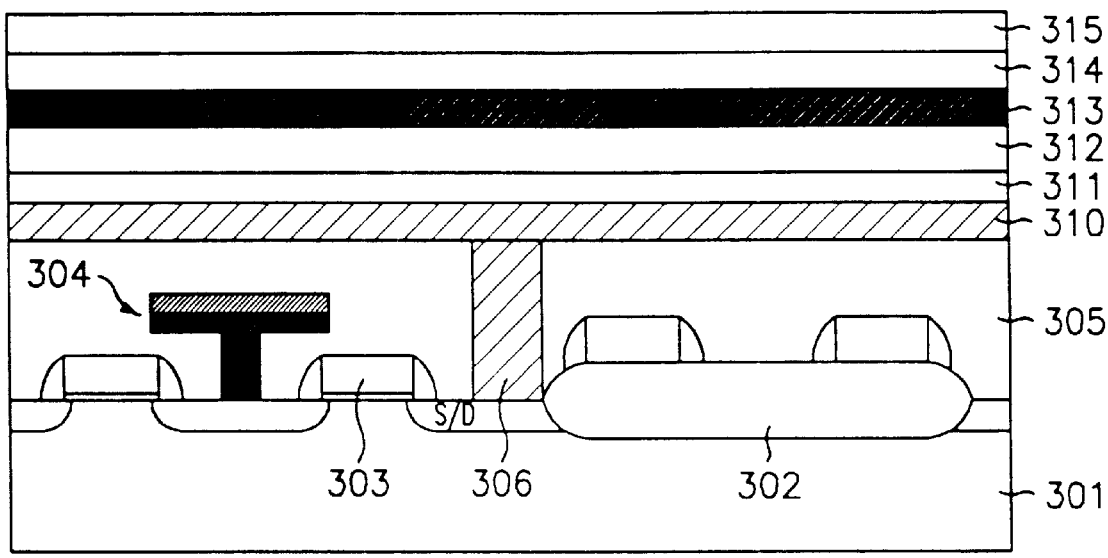
FIGS. 5A to 5F are cross-sectional views illustrating a method for fabricating a memory device having a ferroelectric capacitor according to further another embodiment of the present invention.

First, referring to FIG. 5A, in similar to the FIG. 3A, an interlayer insulating film 305 for planarization is formed on the resulting structure, after forming a MOSFET including a gate 303, a source and drain (S/D) and a bit line 304 in predetermined area of a semiconductor substrate 301. Then, after forming contact hole exposing the source and drain (S/D), a polysilicon plug 306 which is in contact with the source and drain (S/D) is formed. Subsequently, a polysilicon film 310 used for a conducting film, a diffusion preventing film 311 and a lower electrode film 312 are, in this order, formed on the interlayer insulating film 305 and a polysilicon plug 306. After depositing and crystallizing a ferroelectric film 313, such as BST, PZT or Y1, on the lower electrode film 312, an upper electrode 314 and a hard mask film 315 are formed in this order on the ferroelectric films 313. It should be noted that the diffusion preventing film 311 can be replaced with various materials which are illustrated in the FIG. 3A.

Figure 5B:
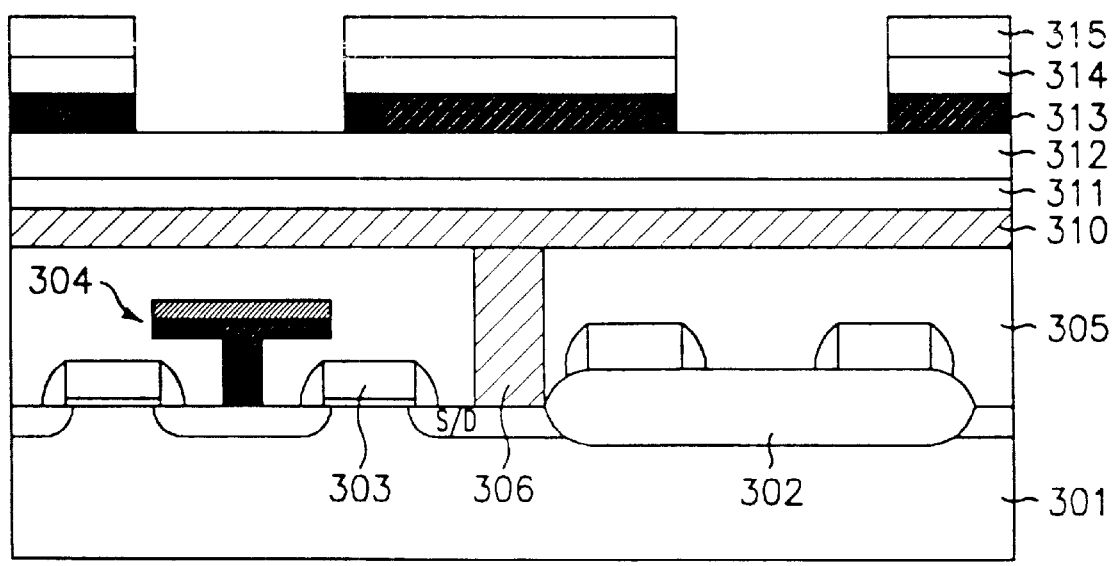

Referring now to FIG. 5B, the hard mask film 315, the charge storage node, the upper electrode 314 and the ferroelectric films 313 are patterned by an etching process using the charge storage mask. The hard mask film 315 may be made of a conducting film or an insulating film and a photoresist film can be used an etching barrier film.

Figure 5C:
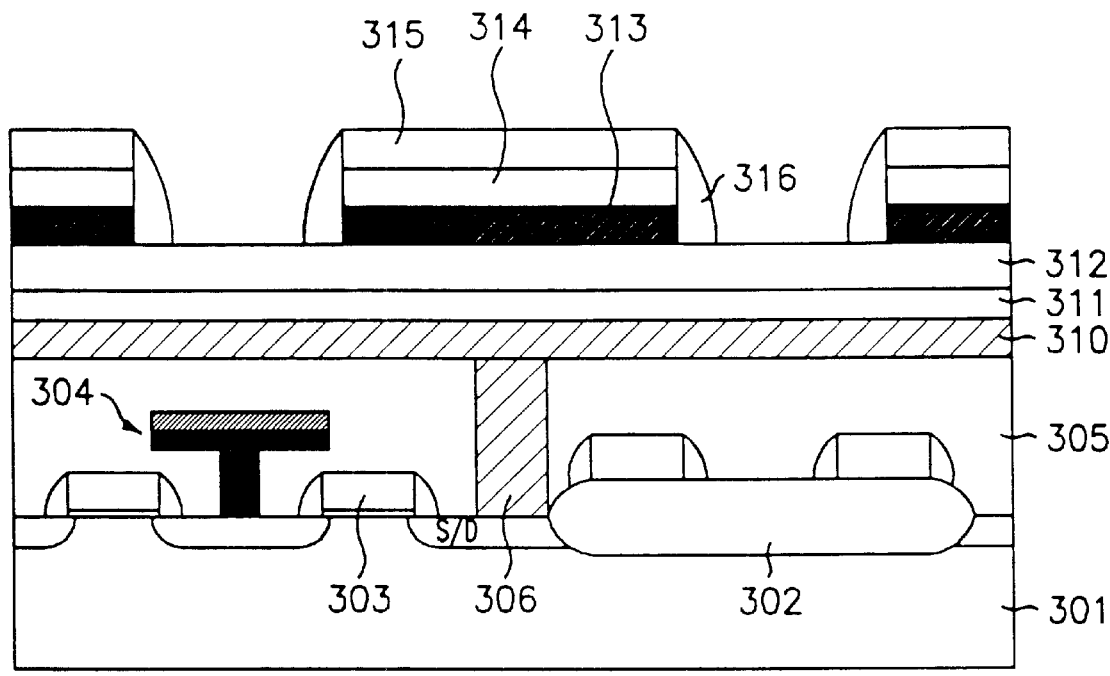

Next, referring to FIG. 5C, an insulating film is deposited on the resulting structure and is subject to an anistropic etching process so that an insulating spacer 316 is formed on the sidewall of the hard mask film 315, the charge storage node, the upper electrode 314 and the ferroelectric films 313, exposing the lower electrode film 312.

Figure 5D:
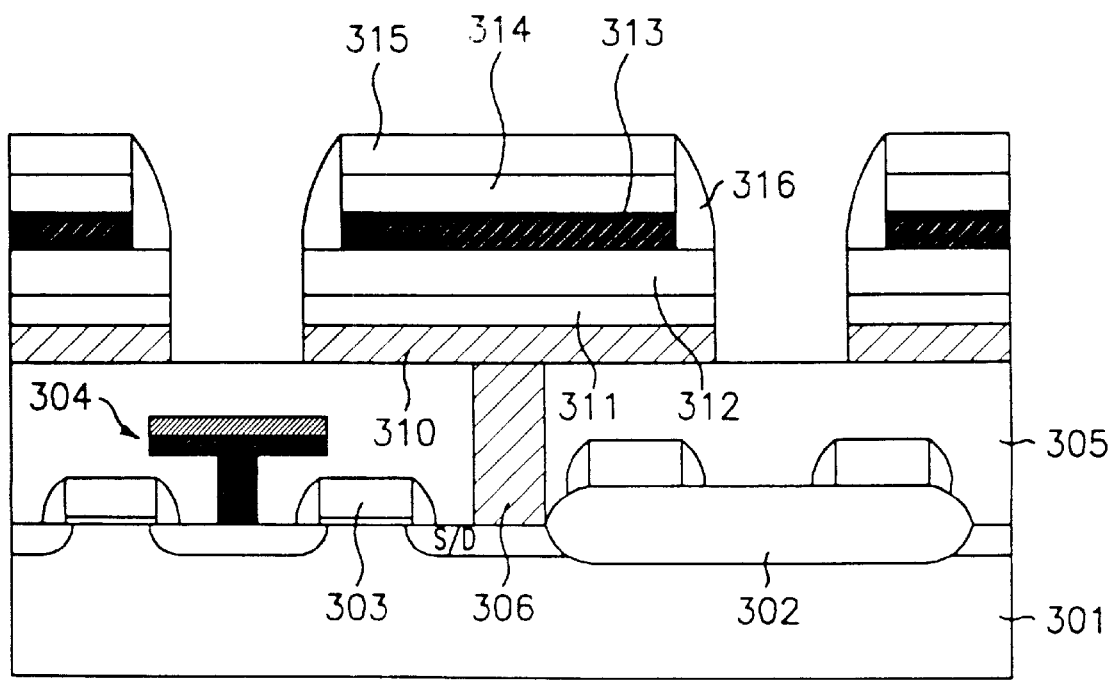

Referring now to FIG. 5D, the lower electrode film 312, the diffusion preventing film 311 and the polysilicon film 310 are patterned by using the hard mask film 315 and the insulating spacer 316 as an etching mask.

Figure 5E:
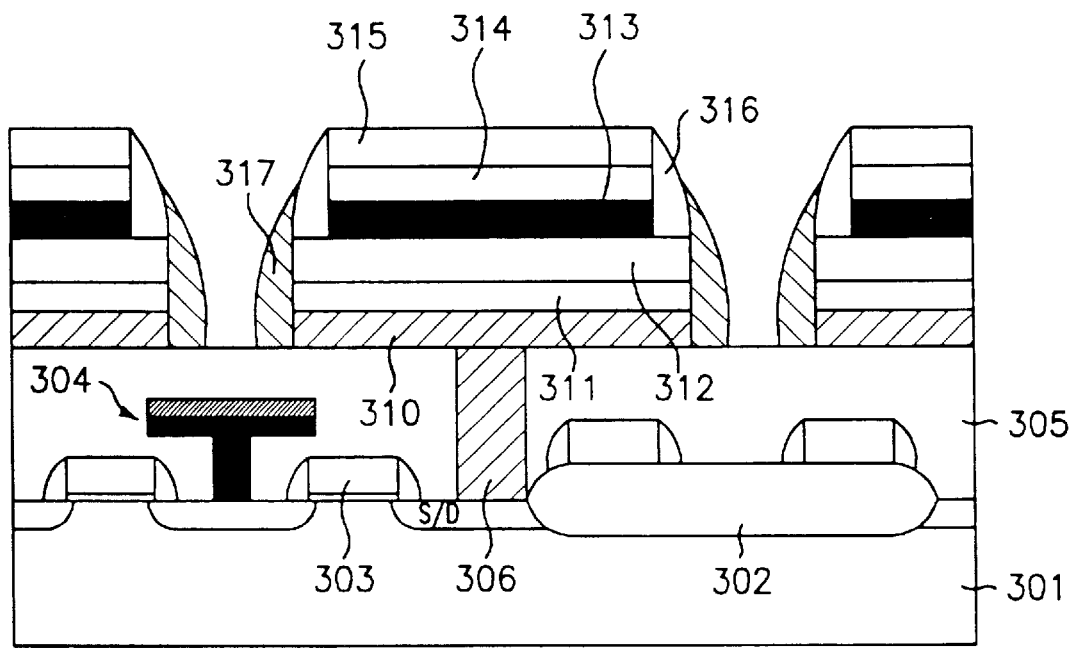

Referring to FIG. 5E, after forming a conducting film is formed on the resulting structure, an anistropic etching process is applied to the conducting film in order to form an conducting spacer film 317 so that separate capacitor is defined with the exposure of the interlayer insulating film 305. At this time, an over-etching is carried out in the range in which the highest part of the conducting spacer 317 should be close to the lower electrode film 312. Even if the diffusion preventing film 311 and the upper surface of the polysilicon film 310 are transformed into an insulating film, for example, an oxide film, the electrical interconnection between the lower electrode film 312 and the lower portion of the polysilicon film 310 is guaranteed.

Figure 5F:
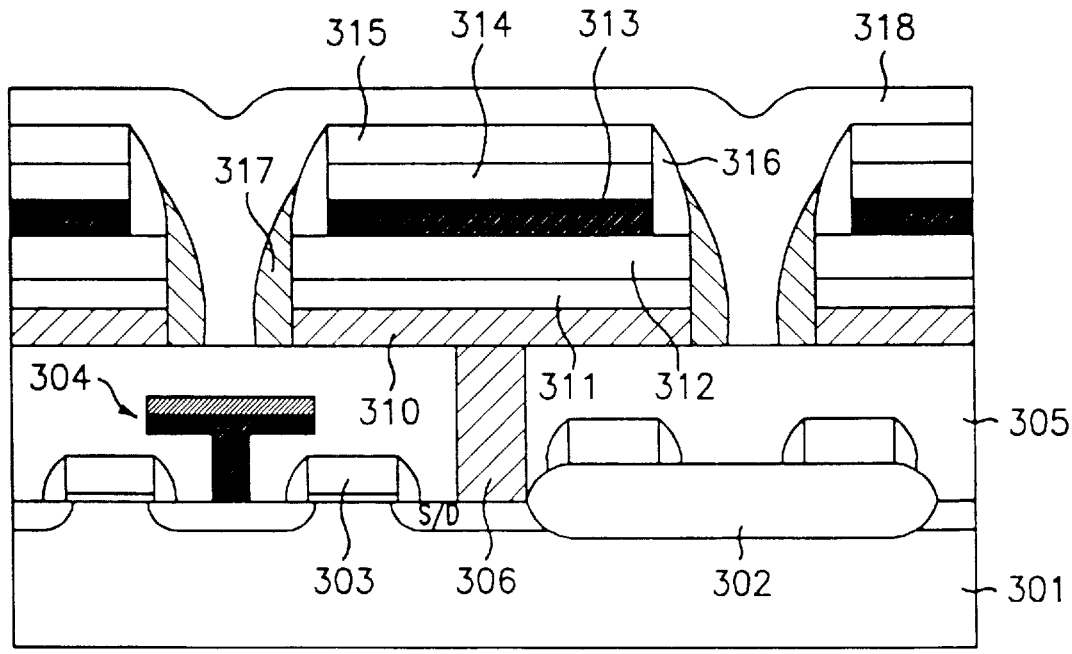

Finally, referring to FIG. 5F, a diffusion preventing film (commonly oxide film) 318 which carries out a role of diffusion barrier is formed to prevent electrical interconnection between conducting films from being broken due to the subsequent oxidization. Accordingly, since the lower part of the conducting spacer 240 and the polysilicon film 210, the upper part of polysilicon plug 206 are protected by thick diffusion preventing film 245, the stacked electrodes of the capacitor are electrically and safely coupled to MOSFET without oxidation although temperature rises in following process.

On the other hand, the diffusion preventing film 311 which is made of semiconductors, nitride films, metal film or an oxide film bearing Si, Ti, Ta, Sr, Bi or Zr, improves the reliability of the electrical interconnection between the lower electrode and the active region of MOSFET. Additionally, in the present invention, it does not matter that the diffusion preventing film 311 comprises a nonconductor of conducting film, while the diffusion preventing film in the prior art had to comprise conductor. Therefore, the range for selection of materials is very wide. This means that the properties of the Pt electrode 312 deposited on diffusion preventing film are optimized. As a matter of fact, if Pt is deposited on Ti barrier film in such as the prior art, the degree of crystallization is very low, as comparison with Pt deposited on SiO in the same condition. Eventually, the extend range selecting the diffusion preventing film materials brings an epochal improvement of the character of capacitor itself since the properties of matter of ferroelectric film highly depends on the lower electrode material and the quality thereof.

Further, in case the conducting spacer 317 is faced with other film except for lower electrode film 312 and the conducting film (polysilicon film 310), that is, if it is faced with the upper electrode film 314 or the ferroelectric films 313, there happens troublesome matter. However, the highly integrated device of the present invention having the same structure as in FIG. 5F can prevent such a matter by the insulating spacer film 316. In other words, the lower electrode film 312 and the upper electrode film 314 of the capacitor must not be electrically connected each other and the lower electrode film 312 and the polysilicon film 310 must not be electrically disconnected. Accordingly, it is difficult to control the size in forming the conducting spacer film 317; however, the sidewalls of dielectric film and upper electrode film 314 surrounded by the insulating spacer film 316 may settle such a matter. Moreover, if the ferroelectric films 313 contact the diffusion preventing film 318 and the conducting spacer film 317, the dielectric character by mutual diffusion in the following processes may be lower. Meanwhile, the insulating spacer film 316 may be also helpful to protect such a trouble.

Figure 1:
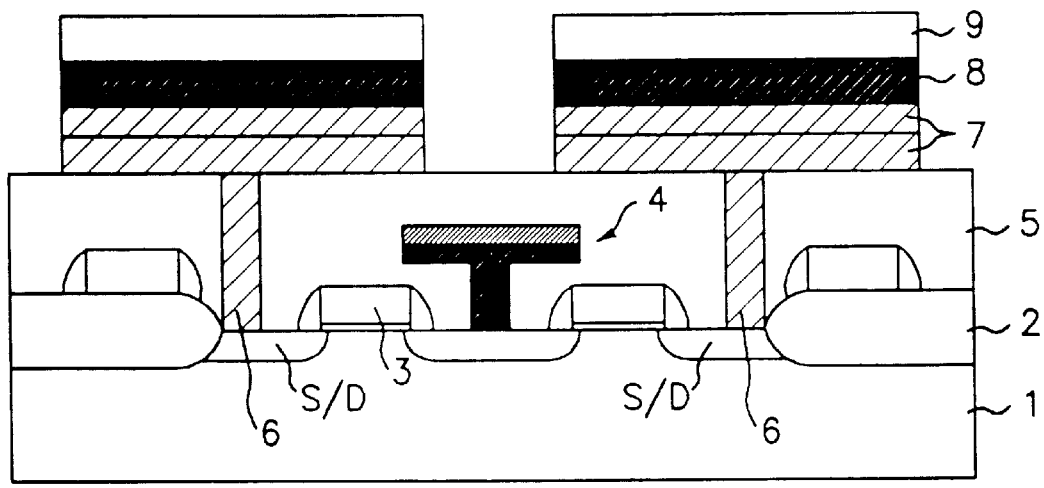
FIG. 1 is a cross-sectional view of a conventional ferroelectric memory device having a Pt film as a lower electrode of a capacitor.

In the conventional memory device illustrated in FIG. 1, the diffusion preventing film must maintain an adhesion between the lower electrode and the polysilicon, prevent oxygen from diffusing into the polysilicon plug, and prevent itself from being oxidized in order not to cause an electrical interconnection fail. Accordingly, materials satisfying these conditions are considerably limited. However, since the present invention can use insulating materials as a diffusion preventing film, the range of selectable materials is extended so that the properties of the Pt electrode may be optimized.

On the other had, the insulating film 316 increases the processing margin because of the self-aligned etching process without an etching mask, thereby decreasing the distance between the charge storage electrodes. Consequently, the chip area in the integrated memory device may not be decreased. As stated above, it is possible to provide additional conducting film for improving adhesion between the films.

In the present invention, the above-mentioned conducting films may be selected from conducting oxide films, conducting nitride films, polysilicon, silicide, metal film including Al, Ti, Cu, W, Ta, Pt, Au, Pd, Ph, Ru, Ir, Re, La, Sr, Sc or Co, or their metal alloy films.

In the preferred embodiment, the diffusion preventing films 220, 251 and 311 blocking oxygen, is one of semiconductor, oxide films or nitride films including Si, Ti, Ta, Sr, Bi or Zr and is deposited by CVD (Chemical Vapor Deposition), PVD (Plasma Vapor Deposition) or SOG (Spin on Glass).

The capacitor electrode is selected from metal films including Pt, Au, Ag, Pd, Rh, Ru, Ir or Re or their metal alloy films, conducting oxide films, conducting nitride films, or silicide films including Ru, Ir, Re, La, Sc or Co.

The dielectric materials have high dielectric constant above 50 such as $Ba(Sr,Ti)O_3$ are ferroelectric materials of the perovskite structure which include doped or undoped $Pb(Zr,Ti)O_3$. Also, they are selected from $SrBi_2Ta_2O_9$, $BaBi_2Nb_2O_9$, $PbBi_2Ta_2O_9$, $BaBi_2Ta_2O_9$, $SrBi_2TaNbO_9$, $SrBi_2Nb_2O_9$, $SrBi_1Ti_4O_{15}$ or $PbBi_2Nb_2O_9$, or their solid solutions.

Further, the ferroelectric materials is one of the layered superlattice materials having the following structure:

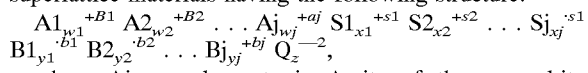

where Aj are elements in A-site of the perovskite structure, Sk are superlattice generator elements, Bl are elements in B-site of the perovskite structure, Q is negative ions., the superscripts denote atoms and the subscripts denote the number of average atoms in a unit cell.

The diffusion preventing films 245, 270 and 318 is one of oxide films or nitride films including Si, Ti, Ta, Sr, Bi or Zr and is deposited by CVD (Chemical Vapor Deposition), PVD (Plasma Vapor Deposition) or SOG (Spin on Glass).

As apparent from the above, the present invention improves an electrical interconnection between a lower electrode of the capacitor and an active region of transistor. Also, the present invention provides excellent film properties of films, by achieving various selection of materials of the charge storage electrode.

Although the preferred embodiments of the invention have been disclosed for illustrative purposes, those skilled in the art will appreciate that various modifications, additions and substitutions are possible without departing from the scope and spirit of the invention as disclosed in the accompanying claims.

What is claimed is:

1. A capacitor in a semiconductor device comprising:
    a first conducting film filling an opening which is formed in an interlayer insulating film, being in contact with an active region of a semiconductor;
    a first stacked structure including a second conducting film formed on the first conducting film and an interlayer insulating film, a first diffusion preventing film formed on the second conducting film, a lower electrode film formed on the first diffusion preventing film;
    a second stacked structure including a ferroelectric film formed on the lower electrode film and an upper electrode film formed on the ferroelectric film;
    an insulating spacer film formed on sidewall of the second stacked structure;
    a conducting spacer film formed on sidewall of the first stacked structure and the insulating spacer film; and
    a second diffusion preventing film formed on sidewalls of the insulating spacer film and the conducting spacer film.

2. The capacitor in accordance with claim 1, wherein the first or second diffusion preventing film is selected from the group consisting of semiconductors, oxide films and nitride films including one of Si, Ti, Ta, Sr, Bi and Zr.

3. The capacitor in accordance with claim 1, wherein the first conducting film and the second conducting film are the same material.

4. The capacitor in accordance with claim 1, wherein the first conducting film and the second conducting film have different material properties, the capacitor further comprises an adhesive conducting film between the first conducting film and the second conducting film.

5. The capacitor in accordance with claim 1, wherein the first conducting film, the second conducting film or the conducting spacer film is selected from the group consisting of conducting oxide films, conducting nitride films, polysilicon, silicide, a metal film including Al, Ti, Cu, W, Ta, Pt, Au, Pd, Rh, Ru, Ir, Re, La, Sr, Sc or Co, and their metal alloy films.

6. The capacitor in accordance with claim 1, wherein the lower or upper electrode film is selected from the group consisting of metal films including Pt, Au, Ag, Pd, Rh, Ru, Ir or Re or their metal alloy films, conducting oxide films, conducting nitride films, and silicide films including one of Ru, Ir, Re, La, Sc and Co.

* * * * *